(12) United States Patent
Matsunaga et al.

(10) Patent No.: US 12,264,963 B2
(45) Date of Patent: Apr. 1, 2025

(54) DETECTION DEVICE

(71) Applicant: Japan Display Inc., Tokyo (JP)

(72) Inventors: Kazuki Matsunaga, Tokyo (JP); Akio Takimoto, Tokyo (JP); Shigesumi Araki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/659,181

(22) Filed: May 9, 2024

(65) Prior Publication Data

US 2024/0288303 A1    Aug. 29, 2024

Related U.S. Application Data

(63) Continuation of application No. PCT/JP2022/041609, filed on Nov. 8, 2022.

(30) Foreign Application Priority Data

Nov. 12, 2021   (JP) .................... 2021-185099

(51) Int. Cl.
  *G01J 1/04*    (2006.01)
  *G01J 1/42*    (2006.01)
(52) U.S. Cl.
  CPC ............... *G01J 1/0407* (2013.01); *G01J 1/42* (2013.01)
(58) Field of Classification Search
  CPC .................................. G01J 1/0407; G01J 1/42
  See application file for complete search history.

(56) References Cited

U.S. PATENT DOCUMENTS 7,893,632 B2 *  2/2011 Meijer ..................... G01J 1/04
                                                   362/335
2012/0085890 A1  4/2012 Kurokawa
(Continued)

FOREIGN PATENT DOCUMENTS

JP   H06-138324 A    5/1994
JP   H11-120324 A    4/1999
JP   2012-165151 A   8/2012
(Continued)

OTHER PUBLICATIONS

Search Report issued in related International Patent Application No. PCT/JP2022/041609 mailed on Feb. 7, 2023 and English translation of same. 5 pages.
(Continued)

*Primary Examiner* — Kevin K Pyo
*Assistant Examiner* — Don J Williams
(74) *Attorney, Agent, or Firm* — K&L Gates LLP

(57) ABSTRACT

According to an aspect, a detection device includes: a plurality of photodiodes arranged on a substrate; a front light including a light guide plate disposed so as to overlap the photodiodes and a light source configured to emit light to a side surface of the light guide plate; and an optical filter layer provided between the photodiodes and the light guide plate of the front light. The optical filter layer includes a plurality of light guide paths that at least partially overlap the photodiodes, and a light-blocking portion having higher absorptance of the light than the light guide paths. The detection device includes a reflective layer that is provided between the light guide plate and the optical filter layer and overlaps the light-blocking portion of the optical filter layer.

15 Claims, 12 Drawing Sheets

(56) References Cited

U.S. PATENT DOCUMENTS

2016/0141321 A1     5/2016   Hsieh et al.
2017/0295289 A1    10/2017   Yoshida et al.

FOREIGN PATENT DOCUMENTS

| JP | 2016-096323 A | 5/2016 |
| JP | 2017-192126 A | 10/2017 |
| JP | 2019-045503 A | 3/2019 |

OTHER PUBLICATIONS

Written Opinion issued in related International Patent Application No. PCT/JP2022/041609 mailed on Feb. 7, 2023. 4 pages.

* cited by examiner

DETECTION DEVICE

CROSS-REFERENCE TO RELATED APPLICATION

This application claims the benefit of priority from Japanese Patent Application No. 2021-185099 filed on Nov. 12, 2021 and International Patent Application No. PCT/JP2022/041609 filed on Nov. 8, 2022, the entire contents of which are incorporated herein by reference.

BACKGROUND

1. Technical Field

What is disclosed herein relates to a detection device.

2. Description of the Related Art

Optical sensors capable of detecting fingerprint patterns, vein patterns, or the like are known (for example, Japanese Patent Application Laid-open Publication No. 2019-045503 (JP-A-2019-045503) and Japanese Patent Application Laid-open Publication No. H11-120324 (JP-A-H11-120324)). The optical sensors described in JP-A-2019-045503 and JP-A-H11-120324 are each provided with a front light on the front side of a plurality of photodiodes. An optical sensor described in JP-A-H11-120324 is provided with a collimator that includes a plurality of light guide paths and a light-blocking portion between the photodiodes and the front light.

In an optical sensor provided with a front light between an object to be detected, such as a finger, and a plurality of photodiodes, light from the object to be detected such as the finger needs to be guided to the photodiodes. Part of light emitted from the front light that travels in the direction opposite to the direction toward the object to be detected such as the finger and directly enters the photodiodes may reduce contrast for detection. In addition, in the optical sensor having the collimator, part of the light emitted from the front light may be absorbed by the light-blocking portion of the collimator, which may reduce the use efficiency of the light.

For the foregoing reasons, there is a need for a detection device that includes a front light and is capable of achieving good detection accuracy.

SUMMARY

According to an aspect, a detection device includes: a plurality of photodiodes arranged on a substrate; a front light including a light guide plate disposed so as to overlap the photodiodes and a light source configured to emit light to a side surface of the light guide plate; and an optical filter layer provided between the photodiodes and the light guide plate of the front light. The optical filter layer includes a plurality of light guide paths that at least partially overlap the photodiodes, and a light-blocking portion having higher absorptance of the light than the light guide paths. The detection device includes a reflective layer that is provided between the light guide plate and the optical filter layer and overlaps the light-blocking portion of the optical filter layer.

DETAILED DESCRIPTION

Figure 1:
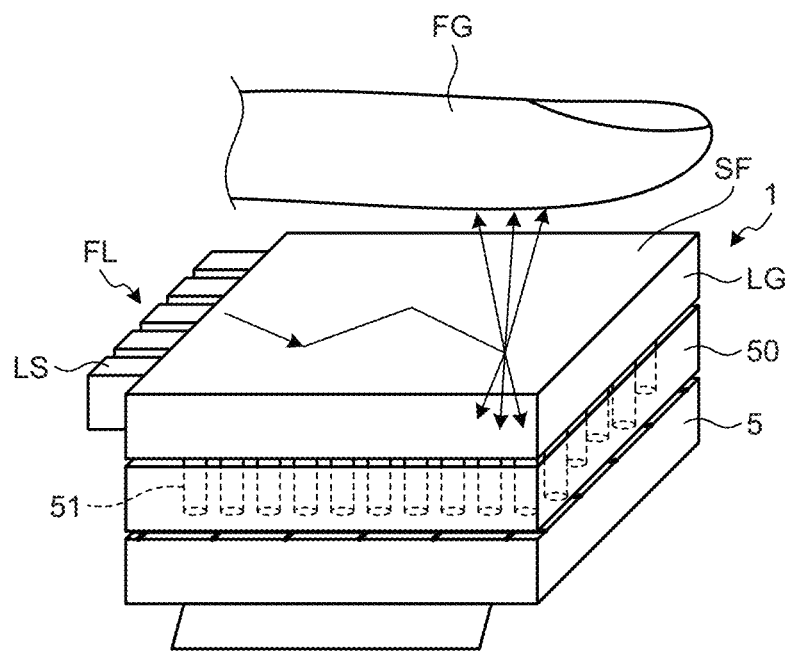
FIG. 1 is a perspective view schematically illustrating a detection device according to a first embodiment of the present disclosure.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

First Embodiment

Figure 2:
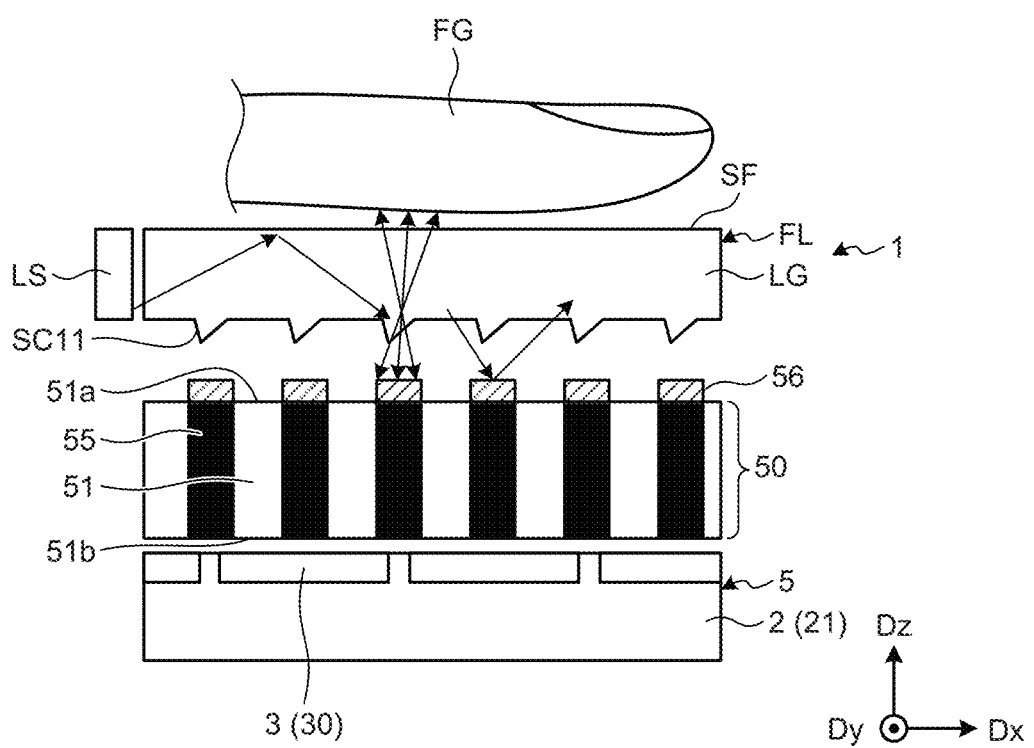
FIG. 2 is a sectional view illustrating a schematic sectional configuration of the detection device according to the first embodiment.

FIG. 1 is a perspective view schematically illustrating a detection device according to a first embodiment of the present disclosure; FIG. 2 is a sectional view illustrating a schematic sectional configuration of the detection device according to the first embodiment. As illustrated in FIGS. 1 and 2, a detection device 1 includes an optical sensor 5, an optical filter layer 50, and a front light FL. The optical filter layer 50 and the front light FL are stacked in this order above the optical sensor 5.

The optical sensor 5 includes an array substrate 2, a plurality of detection elements 3 (photodiodes 30) formed on the array substrate 2. The array substrate 2 is formed using a substrate 21 as a base. Each of the detection elements 3 is configured with a corresponding one of the photodiodes 30, a plurality of transistors, and various types of wiring. The array substrate 2 with the photodiodes 30 formed thereon is a drive circuit board for driving the sensor on a predetermined detection area basis, and is also called a backplane or an active matrix substrate.

The optical filter layer 50 is arranged so as to face the photodiodes 30 and arranged between the photodiodes 30 and a group of a light guide plate LG of the front light FL and an object to be detected FG such as a finger. The optical filter layer 50 includes a plurality of light guide paths 51 and a light-blocking portion 55 provided around the light guide paths 51. At least some of the light guide paths 51 overlap the photodiodes 30. The light-blocking portion 55 has higher absorptance of the light than the light guide paths 51. The optical filter layer 50 is an optical element that transmits components of light reflected by the object to be detected FG such as the finger that travel in a third direction Dz toward the photodiodes 30. The optical filter layer 50 is also called collimating apertures or a collimator.

In the following description, a first direction Dx is one direction in a plane parallel to the substrate 21. A second direction Dy is one direction in the plane parallel to the substrate 21 and is a direction orthogonal to the first direction Dx. The second direction Dy may non-orthogonally intersect the first direction Dx. The third direction Dz is a direction orthogonal to the first direction Dx and the second direction Dy, and is a direction normal to a principle surface of the substrate 21. The term "plan view" refers to a positional relation when viewed in a direction orthogonal to the substrate 21.

The front light FL is arranged on the optical filter layer 50, that is, on the front side of the optical sensor 5 and the optical filter layer 50. The front light FL includes the light guide plate LG having light-transmitting properties, a light source LS facing a side surface of the light guide plate LG, and a plurality of scattering portions SC11. The optical filter layer 50 and the front light FL are bonded together with an optical resin therebetween, which is not illustrated. A space (air layer) may be provided between the optical filter layer 50 and the front light FL.

The light source LS is, for example, light-emitting diodes (LEDs) that emit red light or infrared light. The light source LS is not limited to these types of light and can be changed to a light source for emitting, for example, green light as appropriate depending on measurement items. The LEDs of the light source LS are arranged along the side surface of the light guide plate LG.

The light guide plate LG is arranged so as to overlap the photodiodes 30. The object to be detected FG is placed so as to face a detection surface SF of the light guide plate LG. The scattering portions SC11 are provided on a surface opposite to the detection surface SF of the light guide plate LG, that is, a surface of the light guide plate LG facing the optical filter layer 50. Moreover, the scattering portions SC11 are provided in an area overlapping the light-blocking portion 55 of the optical filter layer 50. The scattering portions SC11 are prismatic (triangular) projecting or recessed portions. The scattering portions SC11 may, however, be dot-shaped projecting or recessed portions.

The detection device 1 includes a reflective layer 56 provided between the light guide plate LG and the optical filter layer 50. The reflective layer 56 is provided in an area overlapping the light-blocking portion 55 of the optical filter layer 50. The reflective layer 56 is not provided in areas overlapping the light guide paths 51 of the optical filter layer 50. The reflective layer 56 is a plate-like member formed of a metal material and is provided parallel to the surface of the light guide plate LG facing the optical filter layer 50. The reflective layer 56 is provided in direct contact with the top of the light-blocking portion 55. However, the reflective layer 56 is not limited to this configuration and may be provided above the light-blocking portion 55 with a resin layer or the like interposed therebetween.

The light emitted from the light source LS propagates in the light guide plate LG while being repeatedly totally reflected on the detection surface SF and the back surface. Part of the light propagating in the light guide plate LG is scattered by the scattering portions SC11. Part of the light scattered by the scattering portions SC11 is emitted from the detection surface SF of the light guide plate LG to the object to be detected FG. Part of the light reflected by the object to be detected FG is applied to the photodiodes 30 through the light guide plate LG and the light guide paths 51 of the optical filter layer 50. As a result, the photodiodes 30 of the optical sensor 5 can detect information on the object to be detected FG using the light emitted from the light source LS.

The light scattered by the scattering portions SC11 includes components emitted to the optical filter layer 50 facing the light guide plate LG, in addition to the components emitted toward the object to be detected FG. Since the scattering portions SC11 are provided in the area overlapping the light-blocking portion 55 of the optical filter layer 50 and the reflective layer 56, the light scattered toward the optical filter layer 50 by the scattering portions SC11 is reflected by the reflective layer 56 and returns to the light guide plate LG without entering the light guide paths 51.

As a result, in the detection device 1, the photodiodes 30 of the optical sensor 5 are mainly irradiated with the light reflected by the object to be detected FG, and part of the light from the front light FL that travels toward the opposite side to the object to be detected FG and directly enter the photodiodes 30 is reduced. Therefore, the detection device 1 including the front light FL can be improved in detection accuracy. Furthermore, the light scattered toward the optical filter layer 50 by the scattering portions SC11 is not absorbed by the light-blocking portion 55 of the optical filter layer 50, but is reflected by the reflective layer 56 and reused. Thus, the detection device 1 can improve the use efficiency of the light because the reflective layer 56 is provided.

The object to be detected FG is, for example, the finger, a palm, or a wrist. For example, the optical sensor 5 can detect information on, for example, a fingerprint of the object to be detected FG based on the light. The optical sensor 5 may also detect various types of information (biometric information) such as shapes of blood vessels, pulsation, and pulse waves. That is, the detection device 1 may be configured as a fingerprint detection device to detect the fingerprint or a vein detection device to detect a vascular pattern of, for example, veins. The light source LS included in the front light FL is not limited to one type. A plurality of types of light sources for emitting light having different wavelengths may be provided.

Figure 3:
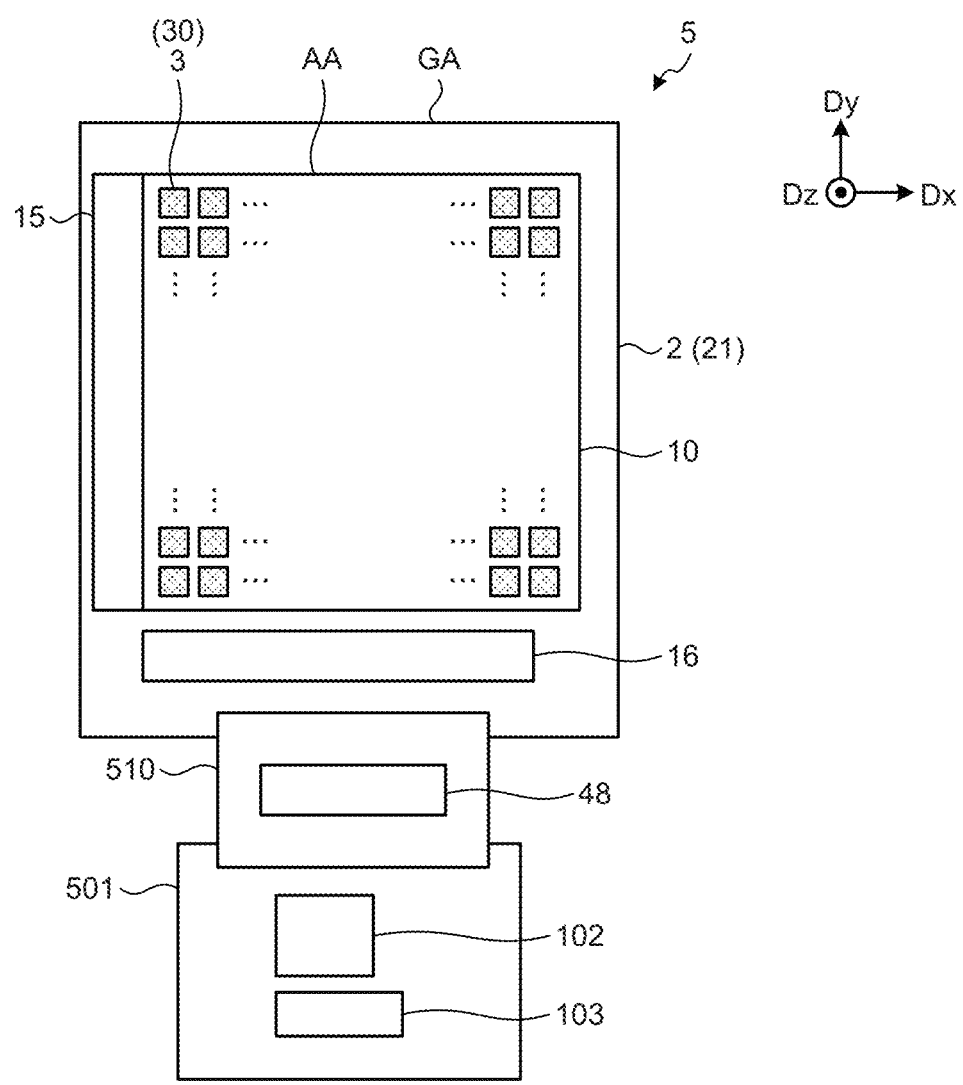
FIG. 3 is a plan view illustrating the detection device according to the first embodiment.

FIG. 3 is a plan view illustrating the detection device according to the first embodiment. As illustrated in FIG. 3, the optical sensor 5 included in the detection device 1 includes the substrate 21 (array substrate 2), a sensor 10, a scan line drive circuit 15, a signal line selection circuit 16, a detection circuit 48, a control circuit 102, and a power supply circuit 103.

The substrate 21 is electrically coupled to a control substrate 501 through a wiring substrate 510. The wiring substrate 510 is, for example, a flexible printed circuit board or a rigid circuit board. The wiring substrate 510 is provided with the detection circuit 48. The control substrate 501 is provided with the control circuit 102 and the power supply circuit 103. The control circuit 102 is, for example, a field-programmable gate array (FPGA). The control circuit 102 supplies control signals to the sensor 10, the scan line drive circuit 15, and the signal line selection circuit 16 to control detection operations of the sensor 10. The control circuit 102 also supplies control signals to the front light FL (refer to FIGS. 1 and 2) to control lighting and non-lighting of the light source LS. The power supply circuit 103 supplies voltage signals including, for example, a power supply potential SVS and a reference potential VR1 (refer to FIG. 5) to the sensor 10, the scan line drive circuit 15, and the signal line selection circuit 16.

The substrate 21 has a detection area AA and a peripheral area GA. The detection area AA is an area provided with the photodiodes 30 included in the sensor 10. The peripheral area GA is an area between the outer perimeter of the detection area AA and the outer edges of the substrate 21, and is an area not provided with the photodiodes 30.

The scan line drive circuit 15 and the signal line selection circuit 16 are provided in the peripheral area GA. Specifically, the scan line drive circuit 15 is provided in an area extending along the second direction Dy in the peripheral area GA. The signal line selection circuit 16 is provided in an area extending along the first direction Dx in the peripheral area GA, and is provided between the sensor 10 and the detection circuit 48.

Each of the detection elements 3 of the sensor 10 is an optical sensor including the photodiode 30 as a sensor element. Each of the photodiodes 30 is a photoelectric conversion element and outputs an electrical signal corresponding to light emitted thereto. More specifically, the photodiode 30 is a positive-intrinsic-negative (PIN) photodiode or an organic photodiode (OPD) using an organic semiconductor. The detection elements 3 (photodiodes 30) are arranged in a matrix having a row-column configuration in the detection area AA.

The photodiode 30 included in each of the detection elements 3 performs the detection in accordance with gate drive signals supplied from the scan line drive circuit 15. Each of the photodiodes 30 outputs the electrical signal corresponding to the light irradiating the photodiode 30 as a detection signal Vdet to the signal line selection circuit 16. The detection device 1 detects the information on the object to be detected FG based on the detection signals Vdet from the photodiodes 30.

Figure 4:
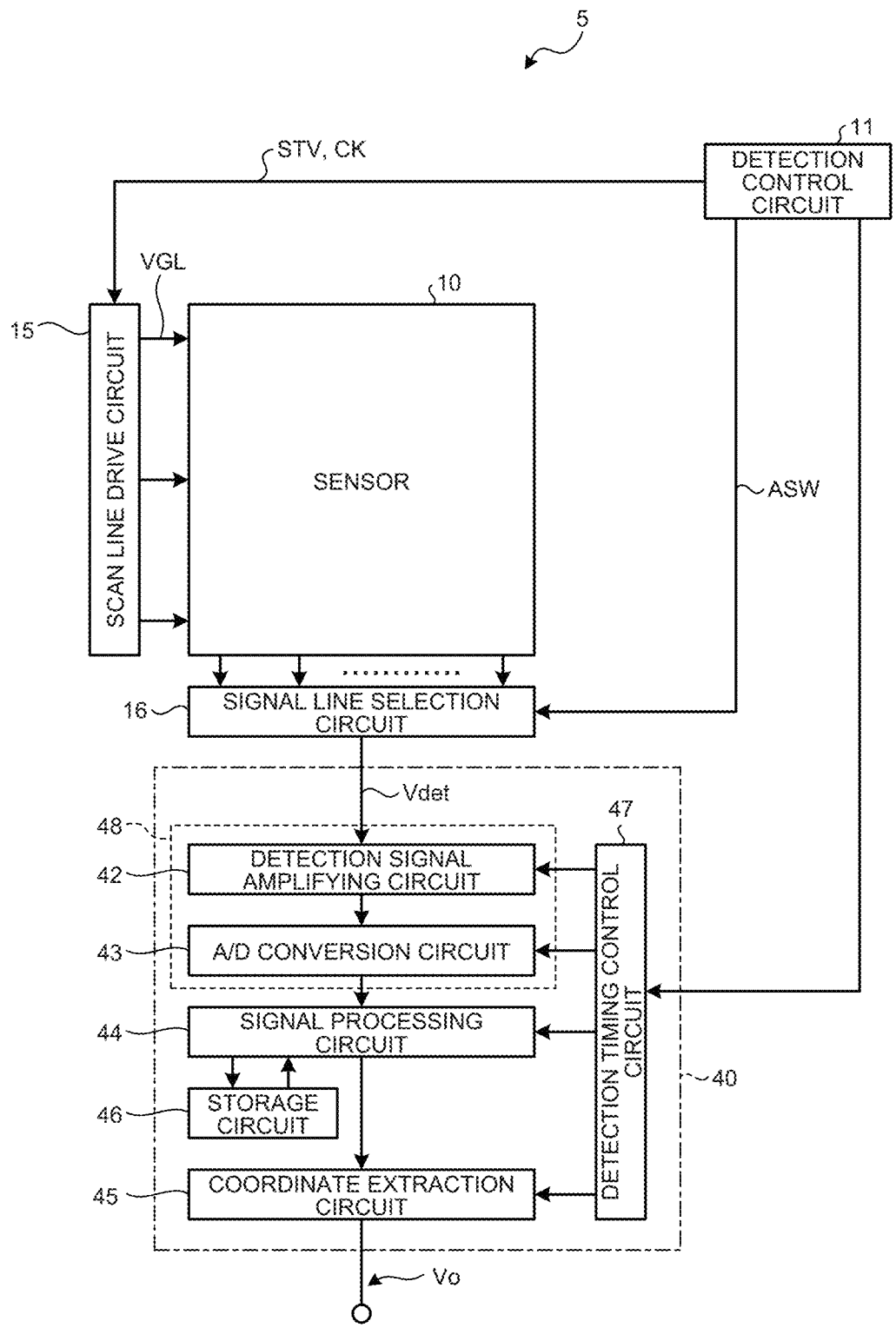
FIG. 4 is a block diagram illustrating a configuration example of the detection device according to the first embodiment.

FIG. 4 is a block diagram illustrating a configuration example of the detection device according to the first embodiment. As illustrated in FIG. 4, the detection device 1 further includes a detection control circuit 11 and a detector (detection processing circuit) 40. The control circuit 102 includes one, some, or all functions of the detection control circuit 11. The control circuit 102 also includes one, some, or all functions of the detector 40 other than those of the detection circuit 48.

The detection control circuit 11 is a circuit that supplies respective control signals to the scan line drive circuit 15, the signal line selection circuit 16, and the detector 40 to control operations of these components. The detection control circuit 11 supplies various control signals including, for example, a start signal STV, a clock signal CK, and a reset signal RST1 to the scan line drive circuit 15. The detection control circuit 11 also supplies various control signals including, for example, a selection signal ASW to the signal line selection circuit 16.

The scan line drive circuit 15 is a circuit that drives a plurality of scan lines GLS (refer to FIG. 5) based on the various control signals. The scan line drive circuit 15 sequentially or simultaneously selects the scan lines GLS and supplies gate drive signals VGL to the selected scan lines GLS. Through this operation, the scan line drive circuit 15 selects the photodiodes 30 coupled to the scan lines GLS.

Figure 5:
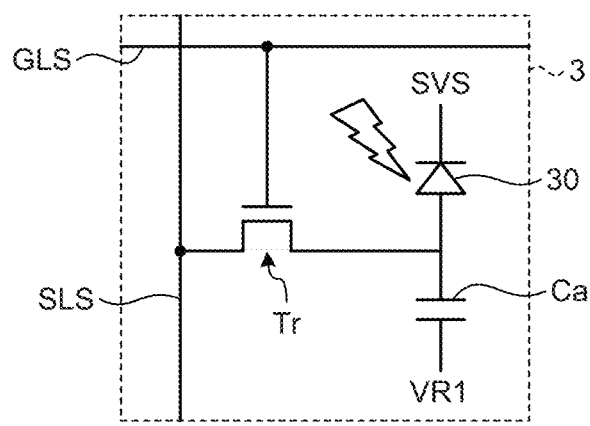
FIG. 5 is a circuit diagram of a detection element.

The signal line selection circuit 16 is a switch circuit that sequentially or simultaneously selects a plurality of output signal lines SLS (refer to FIG. 5). The signal line selection circuit 16 is, for example, a multiplexer. The signal line selection circuit 16 couples the selected output signal lines SLS to the detection circuit 48 based on the selection signal ASW supplied from the detection control circuit 11. Through this operation, the signal line selection circuit 16 outputs the detection signals Vdet of the photodiodes 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 amplifies the detection signals Vdet. The A/D conversion circuit 43 converts analog signals output from the detection signal amplifying circuit 42 into digital signals.

The signal processing circuit 44 is a logic circuit that detects a predetermined physical quantity received by the sensor 10 based on output signals of the detection circuit 48. The signal processing circuit 44 can detect asperities on the surface of the finger or the palm based on the signals from the detection circuit 48 when the finger is in contact with or in proximity to the detection surface SF (light guide plate LG). The signal processing circuit 44 can detect information on a living body based on the signals from the detection circuit 48. Examples of the information on the living body include a vascular image, the pulse waves, the pulsation, and a blood oxygen level of the finger or the palm.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger or the like when the contact or proximity of the finger is detected by the signal processing circuit 44. The coordinate extraction circuit 45 is the logic circuit that also obtains detected coordinates of the blood vessels in the finger or the palm. The coordinate extraction circuit 45 combines the detection signals Vdet output from the photodiodes 30 of the sensor 10 to generate two-dimensional information indicating the shape of the asperities on the surface of the finger or the like and two-dimensional information indicating the shape of the blood vessels in the finger or the palm. The coordinate extraction circuit 45 may output the detection signals Vdet as sensor output voltages Vo instead of calculating the detected coordinates.

The following describes a circuit configuration example of the optical sensor 5. FIG. 5 is a circuit diagram of the detection element. As illustrated in FIG. 5, the detection element 3 includes the photodiode 30, a capacitive element Ca, and a first transistor Tr. The first transistor Tr is provided correspondingly to the photodiode 30. The first transistor Tr is formed of a thin-film transistor, and in this example, formed of an n-channel metal oxide semiconductor (MOS) thin-film transistor (TFT). The gate of the first transistor Tr is coupled to a corresponding one of the scan lines GLS. The source of the first transistor Tr is coupled to a corresponding one of the output signal lines SLS. The drain of the first transistor Tr is coupled to the anode of the photodiode 30 and the capacitive element Ca.

The cathode of the photodiode 30 is supplied with the power supply potential SVS from the power supply circuit 103. The capacitive element Ca is supplied with the reference potential VR1 serving as an initial potential of the capacitive element Ca from the power supply circuit 103.

Irradiating the detection element 3 conducts a current corresponding to the amount of the light through the photodiode 30, and thereby stores an electric charge in the capacitive element Ca. Turning on the first transistor Tr conducts a current corresponding to the electric charge stored in the capacitive element Ca through the output signal line SLS. The output signal line SLS is coupled to the detection circuit 48 through the signal line selection circuit 16. Thus, the detection device 1 can detect a signal corresponding to the amount of the light applied to the photodiode 30 for each of the detection elements 3.

Although FIG. 5 illustrates one of the detection elements 3, the scan line GLS and the output signal line SLS are coupled to a plurality of the detection elements 3. Specifically, the scan line GLS extends in the first direction Dx (refer to FIG. 3), and is coupled to the detection elements 3 arranged in the first direction Dx. The output signal line SLS extends in the second direction Dy, and is coupled to the detection elements 3 arranged in the second direction Dy.

The first transistor Tr is not limited to the n-type TFT, and may be configured as a p-type TFT. The detection element 3 may be provided with a plurality of transistors corresponding to one photodiode 30.

Figure 6:
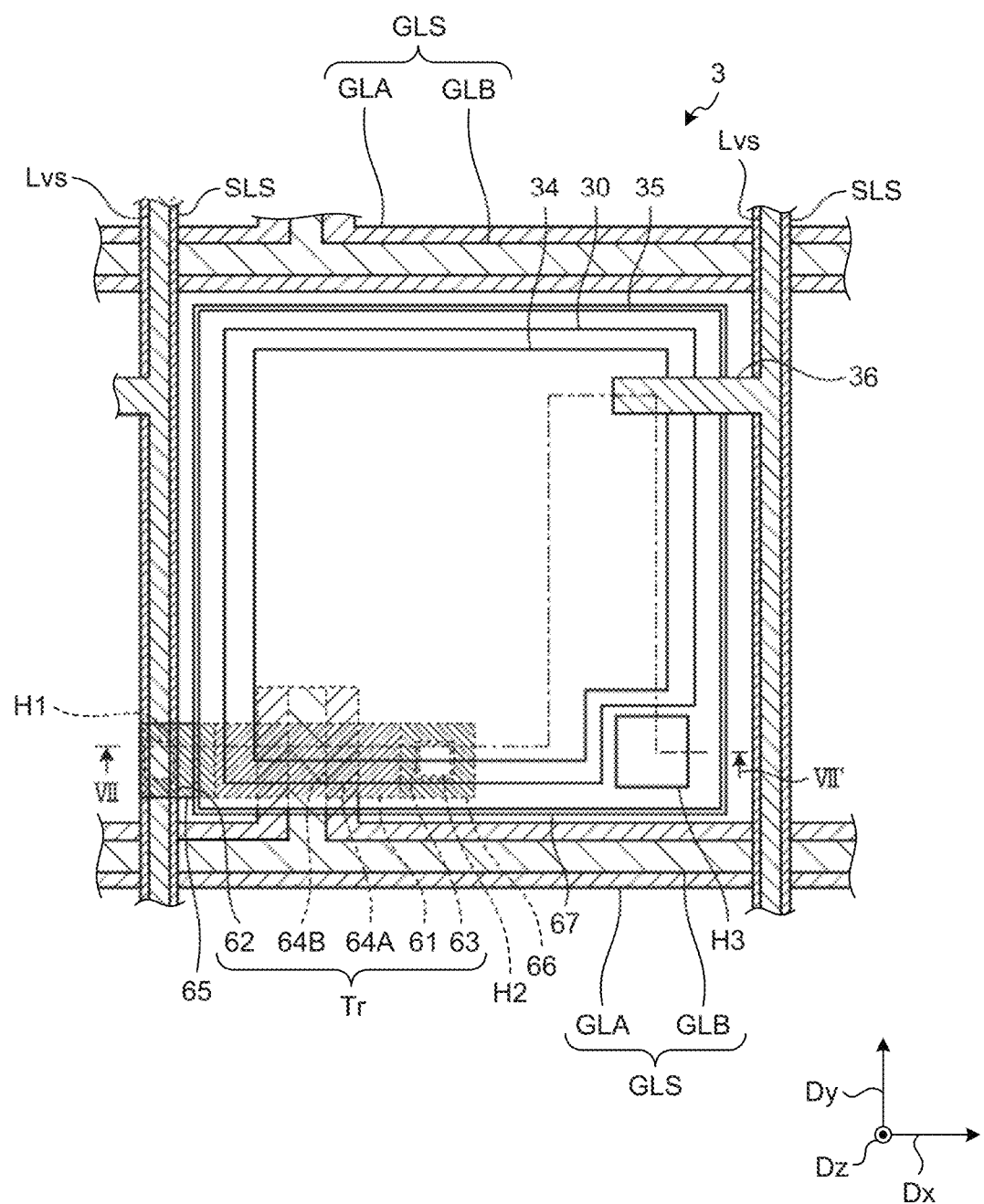
FIG. 6 is a plan view schematically illustrating the detection element according to the first embodiment.

The following describes a detailed circuit configuration of the detection device 1. FIG. 6 is a plan view schematically illustrating the detection element according to the first embodiment. As illustrated in FIG. 6, the detection element 3 is an area surrounded by the scan lines GLS and the output signal lines SLS. In the present embodiment, the scan line GLS includes a first scan line GLA and a second scan line GLB. The first scan line GLA is provided so as to overlap the second scan GLB. The first and the second scan lines GLA and GLB are provided in different layers with insulating layers 22c and 22d (refer to FIG. 7) interposed therebetween. The first and the second scan lines GLA and GLB are electrically coupled together at any point, and are supplied with the gate drive signals VGL having the same potential. The first scan lines GLA, the second scan lines GLB, or both are coupled to the scan line drive circuit 15. In FIG. 6, the first scan line GLA and the second scan line GLB have different widths, but may have the same width.

The photodiode 30 is provided in the area surrounded by the scan lines GLS and the output signal lines SLS. An upper electrode 34 and a lower electrode 35 are provided correspondingly to each of the photodiodes 30. The photodiode 30 is a PIN photodiode, for example. The lower electrode 35 is, for example, an anode electrode of the photodiode 30. The upper electrode 34 is, for example, a cathode electrode of the photodiode 30.

The upper electrode 34 is coupled to a power supply signal line Lvs through coupling wiring 36. The power supply signal line Lvs is wiring that supplies the power supply potential SVS to the photodiode 30. In the present embodiment, the power supply signal line Lvs extends in the second direction Dy while overlapping the output signal line SLS. The detection elements 3 arranged in the second direction Dy are coupled to the same power supply signal line Lvs. Such a configuration can enlarge an opening for the detection element 3. The lower electrode 35, the photodiode 30, and the upper electrode 34 are substantially quadrilateral in plan view. However, the shapes of the lower electrode 35, the photodiode 30, and the upper electrode 34 are not limited thereto, and can be modified as appropriate.

The first transistor Tr is provided near an intersection between the scan line GLS and the output signal line SLS. The first transistor Tr includes a semiconductor layer 61, a source electrode 62, a drain electrode 63, a first gate electrode 64A, and a second gate electrode 64B.

The semiconductor layer 61 is an oxide semiconductor. The semiconductor layer 61 is more preferably a transparent amorphous oxide semiconductor (TAOS) as one of the oxide semiconductors. Using an oxide semiconductor as the first transistor Tr can reduce a leakage current of the first transistor Tr. That is, the first transistor Tr can reduce the leakage current from the detection element 3 that is not selected. Therefore, the detection device 1 can improve the signal-to-noise ratio (S/N). The semiconductor layer 61 is, however, not limited thereto and may be formed of, for example, a microcrystalline oxide semiconductor, an amorphous oxide semiconductor, polysilicon, or low-temperature polycrystalline silicon (LTPS).

The semiconductor layer 61 is provided along the first direction Dx and intersects the first and the second gate electrodes 64A and 64B in plan view. The first and the second gate electrodes 64A and 64B are provided so as to branch from the first and the second sensor gate lines GLA and GLB, respectively. In other words, portions of the first and the second scan lines GLA and GLB that overlap the semiconductor layer 61 serve as the first and the second gate electrodes 64A and 64B. Aluminum (Al), copper (Cu), silver (Ag), molybdenum (Mo), or an alloy of these metals is used as the first and the second gate electrodes 64A and 64B. Channel regions are formed at portions of the semiconductor layer 61 that overlap the first and the second gate electrodes 64A and 64B.

One end of the semiconductor layer 61 is coupled to the source electrode 62 through a contact hole H1. The other end of the semiconductor layer 61 is coupled to the drain electrode 63 through a contact hole H2. A portion of the output signal line SLS that overlaps the semiconductor layer 61 serves as the source electrode 62. A portion of a third conductive layer 67 that overlaps the semiconductor layer 61 serves as the drain electrode 63. The third conductive layer 67 is coupled to the lower electrode 35 through a contact hole H3. Such a configuration allows the first transistor Tr to switch between coupling and decoupling between the photodiode 30 and the output signal line SLS.

The arrangement pitch of the detection elements 3 (photodiodes 30) in the first direction Dx is defined by the arrangement pitch of the output signal lines SLS in the first direction Dx. The arrangement pitch of the detection elements 3 (photodiodes 30) in the second direction Dy is defined by the arrangement pitch of the scan lines GLS in the second direction Dy.

Figure 7:
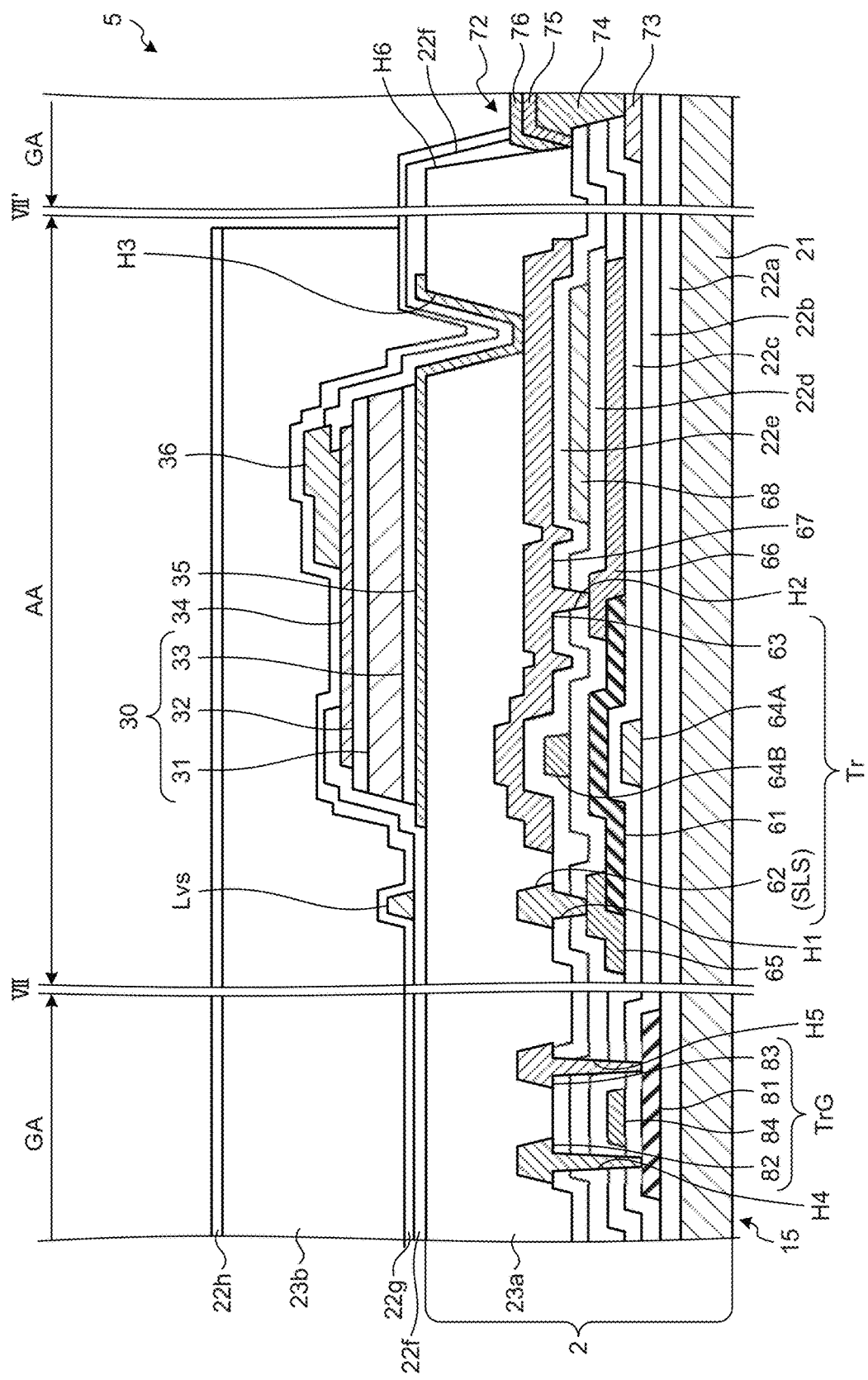
FIG. 7 is a sectional view along VII-VII' of FIG. 6.

The following describes a layer configuration of the optical sensor 5. FIG. 7 is a sectional view along VII-VII' of FIG. 6. In order to illustrate a relation between the layer structure of the detection area AA (refer to FIG. 3) and the layer structure of the peripheral area GA (refer to FIG. 3), FIG. 7 illustrates a section taken along a line VII-VII' and a section of a portion of the peripheral area GA that includes a second transistor TrG in a schematically connected manner. FIG. 7 further illustrates a section of a portion of the peripheral area GA that includes a terminal 72 in a schematically connected manner.

In the description of the optical sensor 5, a direction from the substrate 21 toward the photodiode 30 in a direction (third direction Dz) orthogonal to a surface of the substrate 21 is referred to as "upper side" or "above". A direction from the photodiode 30 toward the substrate 21 is referred to as "lower side" or "below".

As illustrated in FIG. 7, the substrate 21 is an insulating substrate, and is made using, for example, a glass substrate of quartz, alkali-free glass, or the like. The first transistors Tr, various types of wiring (the scan lines GLS and the output signal lines SLS) and insulating layers are provided to form the array substrate 2 on one surface of the substrate 21. The photodiodes 30 are arranged on the array substrate 2, that is, on the one surface side of the substrate 21. The substrate 21 may be a resin substrate or a resin film made of a resin such as polyimide.

Insulating layers 22a and 22b are provided on the substrate 21. Insulating layers 22a, 22b, 22c, 22d, 22e, 22f, and 22g are inorganic insulating films, and are formed of a silicon oxide ($SiO_2$) or a silicon nitride (SiN). Each of the inorganic insulating layers is not limited to a single layer and may be a multilayered film.

The first gate electrode 64A is provided on the insulating layer 22b. The insulating layer 22c is provided on the insulating layer 22b so as to cover the first gate electrode 64A. The semiconductor layer 61, a first conductive layer 65, and a second conductive layer 66 are provided on the insulating layer 22c. The first conductive layer 65 is provided so as to cover an end of the semiconductor layer 61 coupled to the source electrode 62. The second conductive layer 66 is provided so as to cover an end of the semiconductor layer 61 coupled to the drain electrode 63.

The insulating layer 22d is provided on the upper side of the insulating layer 22c so as to cover the semiconductor layer 61, the first conductive layer 65, and the second conductive layer 66. The second gate electrode 64B is provided on the insulating layer 22d. The semiconductor layer 61 is provided between the first gate electrode 64A and the second gate electrode 64B in the direction orthogonal to the substrate 21. That is, the first transistor Tr has what is called a dual-gate structure. The first transistor Tr may, however, have a bottom-gate structure that is provided with the first gate electrode 64A and not provided with the second gate electrode 64B, or a top-gate structure that is not provided with the first gate electrode 64A and provided with only the second gate electrode 64B.

The insulating layer 22e is provided on the upper side of the insulating layer 22d so as to cover the second gate electrode 64B. The source electrode 62 (output signal line SLS) and the drain electrode 63 (third conductive layer 67) are provided on the insulating layer 22e. In the present embodiment, the drain electrode 63 is the third conductive layer 67 provided above the semiconductor layer 61 with the insulating layers 22d and 22e interposed therebetween. The source electrode 62 is electrically coupled to the semiconductor layer 61 through the contact hole H1 and the first conductive layer 65. The drain electrode 63 is electrically coupled to the semiconductor layer 61 through the contact hole H2 and the second conductive layer 66.

The third conductive layer 67 is provided in an area overlapping the photodiode 30 in plan view. The third conductive layer 67 is provided also on the upper side of the semiconductor layer 61 and the first and the second gate electrodes 64A and 64B. That is, the third conductive layer 67 is provided between the second gate electrode 64B and the lower electrode 35 in the direction orthogonal to the substrate 21. With this configuration, the third conductive layer 67 has a function as a protective layer that protects the first transistor Tr.

The second conductive layer 66 extends so as to face the third conductive layer 67 in an area not overlapping the semiconductor layer 61. A fourth conductive layer 68 is provided on the insulating layer 22d in the area not overlapping the semiconductor layer 61. The fourth conductive layer 68 is provided between the second conductive layer 66 and the third conductive layer 67. This configuration generates capacitance between the second conductive layer 66 and the fourth conductive layer 68, and capacitance between the third conductive layer 67 and the fourth conductive layer 68. The capacitance generated by the second conductive layer 66, the third conductive layer 67, and the fourth conductive layer 68 serves as capacitance of the capacitive element Ca illustrated in FIG. 5.

A first organic insulating layer 23a is provided on the insulating layer 22e so as to cover the source electrode 62 (output signal line SLS) and the drain electrode 63 (third conductive layer 67). The first organic insulating layer 23a is a planarizing layer that planarizes asperities formed by the first transistor Tr and various conductive layers.

The following describes a sectional configuration of the photodiode 30. In the photodiode 30, the lower electrode 35, the photodiode 30, and the upper electrode 34 are stacked in this order on the first organic insulating layer 23a of the array substrate 2.

The lower electrode 35 is provided on the first organic insulating layer 23a and is electrically coupled to the third conductive layer 67 through the contact hole H3. The lower electrode 35 is the anode of the photodiode 30 and is an electrode for reading the detection signal Vdet. For example, a metal material such as molybdenum (Mo) or aluminum (Al) is used as the lower electrode 35. The lower electrode 35 may alternatively be a multilayered film formed of a plurality of layers of these metal materials. The lower electrode 35 may be formed of a light-transmitting conductive material such as indium tin oxide (ITO) or indium zinc oxide (IZO).

The photodiode 30 includes an i-type semiconductor layer 31, an n-type semiconductor layer 32, and a p-type semiconductor layer 33 as semiconductor layers. The i-type semiconductor layer 31, the n-type semiconductor layer 32, and the p-type semiconductor layer 33 are formed of amorphous silicon (a-Si), for example. In FIG. 7, the p-type semiconductor layer 33, the i-type semiconductor layer 31, and the n-type semiconductor layer 32 are stacked in this order in the direction orthogonal to the surface of the substrate 21. However, the photodiode 30 may have a reversed configuration. That is, the n-type semiconductor layer 32, the i-type semiconductor layer 31, and the p-type semiconductor layer 33 may be stacked in this order. Each of the semiconductor layers may be a photoelectric conversion element formed of an organic semiconductor.

The a-Si of the n-type semiconductor layer 32 is doped with impurities to form an n+ region. The a-Si of the p-type semiconductor layer 33 is doped with impurities to form a p+ region. The i-type semiconductor layer 31 is, for example, a non-doped intrinsic semiconductor, and has lower conductivity than that of the n-type semiconductor layer 32 and the p-type semiconductor layer 33.

The upper electrode 34 is the cathode of the photodiode 30 and is an electrode for supplying the power supply potential SVS to the photoelectric conversion layers. The upper electrode 34 is, for example, a light-transmitting conductive layer of, for example, ITO, and a plurality of the upper electrodes 34 are provided for the respective photodiodes 30.

The insulating layers 22*f* and 22*g* are provided on the first organic insulating layer 23*a*. The insulating layer 22*f* covers the periphery of the upper electrode 34, and is provided with an opening in a position overlapping the upper electrode 34. The coupling wiring 36 is coupled to the upper electrode 34 at a portion of the upper electrode 34 not provided with the insulating layer 22*f*. The insulating layer 22*g* is provided on the insulating layer 22*f* so as to cover the upper electrode 34 and the coupling wiring 36. A second organic insulating layer 23*b* serving as a planarizing layer is provided on the insulating layer 22*g*. If the photodiode 30 is made of organic semiconductors, an insulating layer 22*h* may be further provided on the photodiode 30.

The second transistor TrG of the scan line drive circuit 15 is provided in the peripheral area GA. The second transistor TrG is provided on the substrate 21 on which the first transistor Tr is provided. The second transistor TrG includes a semiconductor layer 81, a source electrode 82, a drain electrode 83, and a gate electrode 84.

The semiconductor layer 81 is polysilicon. The semiconductor layer 81 is more preferably low-temperature polysilicon (LTPS). The semiconductor layer 81 is provided on the insulating layer 22*a*. That is, the semiconductor layer 61 of the first transistor Tr is provided in a position farther from the substrate 21 than the semiconductor layer 81 of the second transistor TrG in the direction orthogonal to the substrate 21. However, the semiconductor layer 81 is not limited to this configuration, and may be formed in the same layer and of the same material as the semiconductor layer 61.

The gate electrode 84 is provided on the upper side of the semiconductor layer 81 with the insulating layer 22*b* interposed therebetween. The gate electrode 84 is provided in the same layer as the first gate electrode 64A. The second transistor TrG has what is called a top-gate structure. However, the second transistor TrG may have a dual-gate structure or a bottom-gate structure.

The source electrode 82 and the drain electrode 83 are provided on the insulating layer 22*e*. The source electrode 82 and the drain electrode 83 are provided in the same layer as the source electrode 62 and the drain electrode 63 of the first transistor Tr. Contact holes H4 and H5 are provided penetrating the insulating layers 22*b* to 22*e*. The source electrode 82 is electrically coupled to the semiconductor layer 81 through the contact hole H4. The drain electrode 83 is electrically coupled to the semiconductor layer 81 through the contact hole H5.

The terminal 72 is provided in a position of the peripheral area GA different from the area where the scan line drive circuit 15 is provided. The terminal 72 includes a first terminal conductive layer 73, a second terminal conductive layer 74, a third terminal conductive layer 75, and a fourth terminal conductive layer 76. The first terminal conductive layer 73 is provided in the same layer as the first gate electrode 64A on the insulating layer 22*b*. A contact hole H6 is provided so as to continue through the insulating layers 22*c*, 22*d*, 22*e* and the first organic insulating layer 23*a*.

The second terminal conductive layer 74, the third terminal conductive layer 75, and the fourth terminal conductive layer 76 are stacked in this order in the contact hole H6, and electrically coupled to the first terminal conductive layer 73. The second terminal conductive layer 74 can be formed using the same material and the same process as those of, for example, the third conductive layer 67. The third terminal conductive layer 75 can be formed using the same material and the same process as those of the lower electrode 35. The fourth terminal conductive layer 76 can be formed using the same material and the same process as those of the coupling wiring 36 and the power supply signal line Lvs (refer to FIG. 6).

While FIG. 7 illustrates one terminal 72, a plurality of the terminals 72 are arranged at intervals. The terminals 72 are electrically coupled to the wiring substrate 510 (refer to FIG. 3) by an anisotropic conductive film (ACF), for example.

The optical sensor 5 is not limited to the structure described above as long as the photodiode 30 can detect light. The optical sensor 5 may detect information other than the information on the fingerprint as long as the optical sensor 5 detects the information by receiving light using the photodiode 30.

Figure 8:
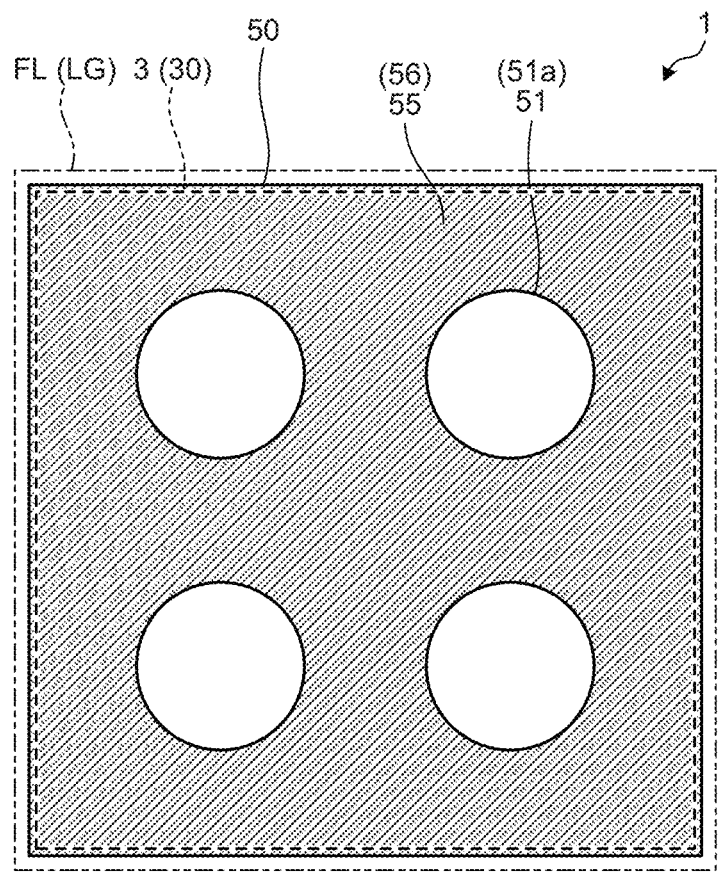
FIG. 8 is a plan view for describing an arrangement relation between a photodiode, an optical filter layer, and a reflective layer.

FIG. 8 is a plan view for describing an arrangement relation between the photodiode, the optical filter layer, and the reflective layer. FIG. 8 illustrates the light-blocking portion 55 of the optical filter layer with diagonal lines. The photodiode 30 is schematically illustrated with a dotted line. The outer shape of the photodiode 30 is, for example, the outer shape of the n-type semiconductor layer 32 (refer to FIG. 7) that forms the light-receiving portion of the photodiode 30.

As illustrated in FIG. 8, the light guide paths 51 of the optical filter layer 50 are arranged in the first direction Dx and the second direction Dy to be arranged in a matrix having a row-column configuration. The light guide paths 51 can each transmit light. As illustrated in FIGS. 8 and 2, the light guide paths 51 each have a first opening 51*a* on the front light FL side and a second opening 51*b* on the photodiode 30 side (refer to FIG. 2). In the present embodiment, the light guide paths 51 extend in the third direction Dz, and the second openings 51*b* are arranged so as to overlap the first openings 51*a* in plan view. The second opening 51*b* has the same area as the first opening 51*a*.

The first and the second openings 51a and 51b of the light guide paths 51 are arranged so as to overlap the photodiodes 30. In FIG. 8, four of the light guide paths 51 are provided so as to overlap one photodiode 30. The arrangement is, however, not limited thereto. Only at least one of the light guide paths 51 needs to be provided so as to overlap one photodiode 30.

The absorptance of the light by the light-blocking portion 55 is higher than by the light guide paths 51. In other words, the transmittance of the light through the light guide paths 51 is higher than the transmittance of the light through the light-blocking portion 55. The light-blocking portion 55 is provided around the light guide paths 51 and made of a member that is difficult to transmit light. The absorptance of the light by the light-blocking portion 55 is preferably from 99% to 100%, and more preferably 100%. The absorptance of the light herein refers to the ratio of the difference between the intensity of incoming light Lin and the intensity of outgoing light Lout to the intensity of the incoming light Lin ((Lin−Lout)/Lin).

The reflective layer 56 is provided in the area overlapping the light-blocking portion 55 of the optical filter layer 50 in plan view. More preferably, the reflective layer 56 is provided so as to cover the entire area of the light-blocking portion 55 and provided with openings in areas overlapping the respective light guide paths 51.

Although FIG. 8 does not illustrate the scattering portions SC11 (refer to FIG. 2), the scattering portions SC11 are provided in the area overlapping the light-blocking portion 55 of the optical filter layer 50, that is, in the area overlapping the reflective layer 56, as described above. The pitch, number, arrangement density, and the like of the scattering portions SC11 can be changed as appropriate depending on the characteristics required for the detection device 1.

Figure 9:
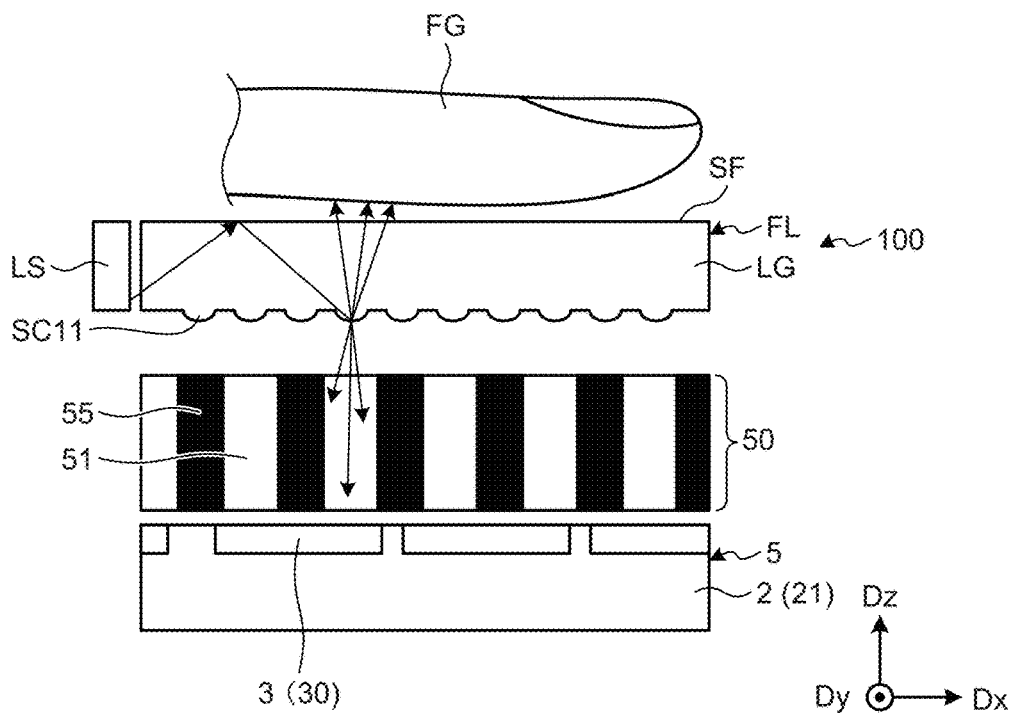
FIG. 9 is a sectional view schematically illustrating a section of a detection device according to a comparative example.

FIG. 9 is a sectional view schematically illustrating a section of a detection device according to a comparative example. In a detection device 100 of the comparative example, the scattering portions SC11 of the front light FL are provided in both the areas overlapping the light guide paths 51 and the area overlapping the light-blocking portion 55. In the detection device 100 according to the comparative example, light scattered at the scattering portions SC11 overlapping the light guide paths 51 can more easily directly reach the photodiode 30. In the detection device 100 of the comparative example, the reflective layer 56 is not provided in the area overlapping the light-blocking portion 55 of the optical filter layer 50. Therefore, in the detection device 100 according to the comparative example, the light scattered at the scattering portions SC11 overlapping the light-blocking portion 55 is absorbed by the light-blocking portion 55, thus reducing the use efficiency of the light.

In contrast, in the present embodiment, as illustrated in FIGS. 2 and 8, the reflective layer 56 is provided in the area that is located between the light guide plate LG and the optical filter layer 50 and overlaps the light-blocking portion 55 of the optical filter layer 50. The scattering portions SC11 of the front light FL are provided in the area overlapping the light-blocking portion 55 of the optical filter layer 50 and are provided so as not to overlap the light guide paths 51. Areas of the light guide plate LG of the front light FL that overlap the light guide paths 51 are formed into flat surfaces where the scattering portions SC11 are not formed. This configuration causes the light scattered upward (toward the object to be detected FG) by the scattering portions SC11 to be reflected by the object to be detected FG such as the finger and enter the photodiode 30 through the light guide paths 51.

In contrast, the light scattered toward the optical filter layer 50 by the scattering portions SC11 does not enter the light guide paths 51 but is reflected by the reflective layer 56 provided on the light-blocking portion 55. That is, the light scattered by the scattering portions SC11 is reflected by the reflective layer 56 without being absorbed by the light-blocking portion 55, and enters the light guide plate LG, and is reused. Thus, the detection device 1 can improve the use efficiency of the light.

In the present embodiment, the scattering portions SC11 are not provided in the areas overlapping the light guide paths 51. Therefore, the light traveling in the light guide plate LG is totally reflected in the area overlapping the light guide paths 51, and light directly entering the light guide paths 51 from the light guide plate LG of the front light FL can be reduced. That is, the detection device 1 can restrain external light other than the light reflected by the object to be detected FG from entering the photodiodes 30. As a result, the noise of the photodiodes 30 is reduced and the sensing sensitivity of the detection device 1 is improved.

The configuration of the optical filter layer 50 can be modified as appropriate. For example, the light guide paths 51 are not limited to extending in the third direction Dz and may be provided so as to be tilted with respect to the third direction Dz. The second opening 51b and the first opening 51a are not limited to having the same area and may have different areas.

Second Embodiment

Figure 10:
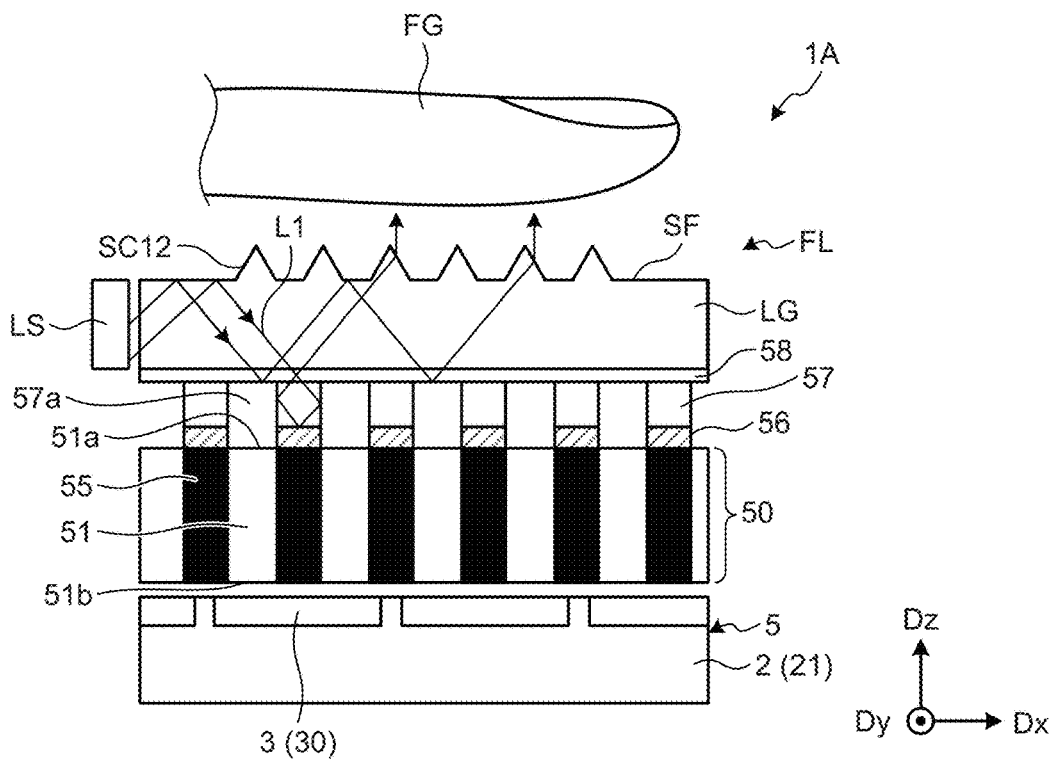
FIG. 10 is a sectional view illustrating a schematic sectional configuration of a detection device according to a second embodiment of the present disclosure.

FIG. 10 is a sectional view illustrating a schematic sectional configuration of a detection device according to a second embodiment of the present disclosure. In the following description, the same components as those described in the embodiment described above are denoted by the same reference numerals, and the description thereof will not be repeated.

As illustrated in FIG. 10, a detection device 1A according to the second embodiment includes a light-transmitting resin layer 57 and an adhesive layer 58 that are provided between the light guide plate LG and the optical filter layer 50. The light-transmitting resin layer 57 is provided between the reflective layer 56 and the light guide plate LG. In more detail, the light-transmitting resin layer 57 is provided in the area overlapping the light-blocking portion 55 of the optical filter layer 50 and is in direct contact with the top of the reflective layer 56. The light guide paths 51 of the optical filter layer 50 are a light-transmitting resin. The areas that are located between the light guide plate LG and the optical filter layer 50 and overlap the light guide paths 51 of the optical filter layer 50 are each provided with an opening 57a of the light-transmitting resin layer 57. The opening 57a of the light-transmitting resin layer 57 is formed of an air layer. That is, the light-transmitting resin layer 57 is not provided in the areas overlapping the light guide paths 51 of the optical filter layer 50.

The light-transmitting resin layer 57 is bonded to the light guide plate LG with the adhesive layer 58 interposed therebetween. The surface of the light guide plate LG facing the optical filter layer 50 is formed to be flat. That is, scattering portions SC12 are provided not on the surface of the light guide plate LG facing the optical filter layer 50, but on the detection surface SF (on the opposite side to the surface facing the optical filter layer 50). The adhesive layer 58 is provided on the surface of the light guide plate LG facing the optical filter layer 50 and is in contact with the light-transmitting resin layer 57. The adhesive layer 58 is provided also in the areas overlapping the light guide paths 51 of the optical filter layer 50 and areas overlapping the openings 57a of the light-transmitting resin layer 57.

The light propagating in the light guide plate LG is totally reflected at interfaces between the adhesive layer 58 on the surface of the light guide plate LG facing the optical filter layer 50 and the air layers (in the openings 57a of the light-transmitting resin layer 57) in the areas overlapping the light guide paths 51, and does not enter the photodiode 30. The light propagating in the light guide plate LG enters the light-transmitting resin layer 57 in the area overlapping the light-blocking portion 55, is repeatedly reflected at interfaces between the light-transmitting resin layer 57 and the air layers (in the openings 57a of the light-transmitting resin layer 57) and at the reflective layer 56, and returns into the light guide plate LG.

Part of the light propagating in the light guide plate LG is scattered by the scattering portions SC12 provided on the detection surface SF, and emitted to the object to be detected FG. Part of the light reflected by the object to be detected FG enters the photodiodes 30 through the light guide plate LG and the light guide paths 51.

Figure 11:
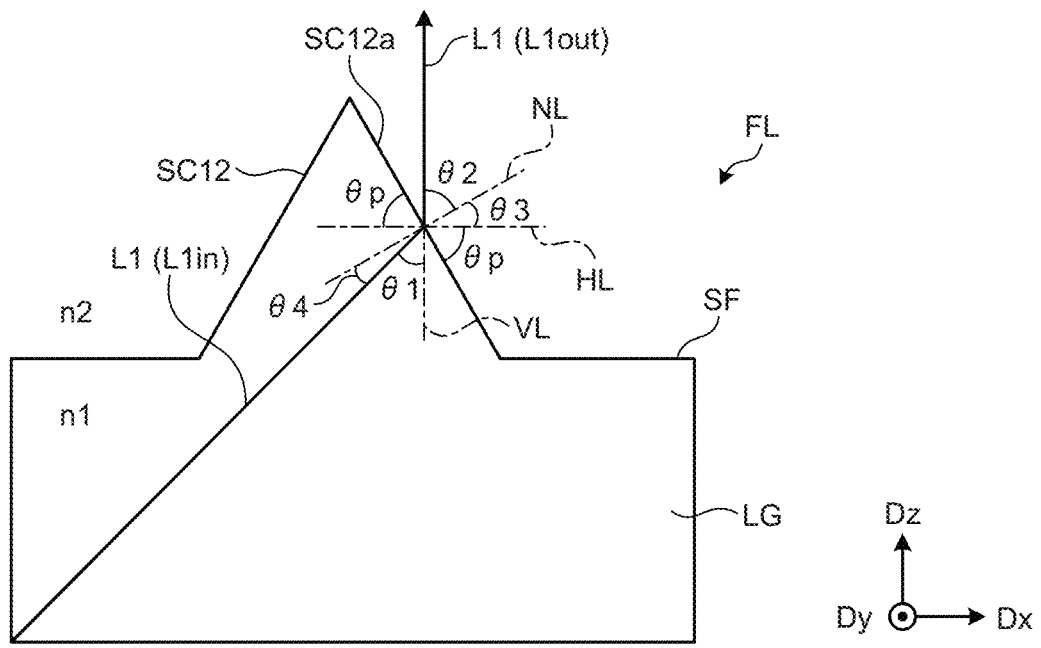
FIG. 11 is a sectional view illustrating a scattering portion of the detection device according to the second embodiment.

FIG. 11 is a sectional view illustrating the scattering portion of the detection device according to the second embodiment. As illustrated in FIG. 11, a sloped surface SC12a of each of the scattering portions SC12 is sloped at an angle θp with respect to a horizontal line HL. The horizontal line HL is an imaginary line parallel to the detection surface SF.

Light Llin propagating in the light guide plate LG has an incident angle of an angle θ1 or larger with respect to a normal VL of the detection surface SF. The angle θ1 is an angle of total reflection of the detection surface SF. If a refractive index n1 of the light guide plate LG is, for example, n1=1.88 and a refractive index n2 of air is n2=1, the angle θ1 is θ1=32.1° or larger.

The light Llin is incident at an angle θ4 with respect to a normal NL of the sloped surface SC12a. The angle θ4 is expressed as θ4=θp−θ1. Light Llout emitted from the scattering portion SC12 is emitted at an angle θ2 toward a side opposite to the direction of incidence of the light Llin with respect to the normal NL of the sloped surface SC12a according to Snell's law. In the example illustrated in FIG. 11, the light Llout travels in a direction parallel to the normal VL of the detection surface SF. In this case, the angle θ2 is θ2=θp. An angle θ3 formed between the normal NL of the sloped surface SC12a and the horizontal line HL is expressed as θ3=90°−θ2=90°−θp. With such a configuration, light L1 that has propagated in the light guide plate LG is emitted by the scattering portions SC12 toward the object to be detected FG.

The shape of the scattering portion SC12 and the angles, such as the angle θp of the sloped surface SC12a, are merely exemplary and can be changed as appropriate.

In the present embodiment, the light-transmitting resin layer 57 and the reflective layer 56 enable the total reflection of the light in the area overlapping the light-blocking portion 55. The scattering portions SC12 are provided on the detection surface SF of the light guide plate LG. This configuration allows a greater degree of freedom to be achieved in positioning of the light guide plate LG and the optical filter layer 50 than in the first embodiment described above, thus making the manufacturing of the detection device 1A easier.

Third Embodiment

Figure 12:
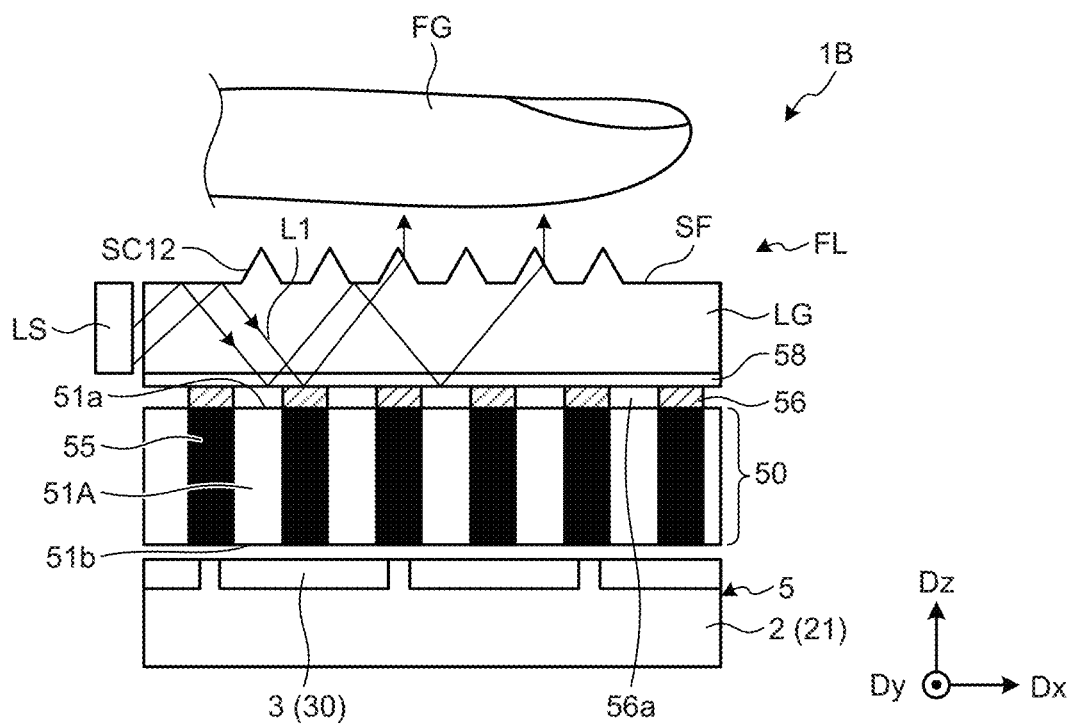
FIG. 12 is a sectional view illustrating a schematic sectional configuration of a detection device according to a third embodiment of the present disclosure.

FIG. 12 is a sectional view illustrating a schematic sectional configuration of a detection device according to a third embodiment of the present disclosure. As illustrated in FIG. 12, a detection device 1B according to the third embodiment is not provided with the light-transmitting resin layer 57, unlike the second embodiment described above. That is, the light guide plate LG is bonded to the reflective layer 56 with the adhesive layer 58 interposed therebetween. The scattering part SC12 is provided on the detection surface SF of the light guide plate LG.

In the present embodiment, light guide paths 51A of the optical filter layer 50 are each formed of an air layer. Areas between the optical filter layer 50 and the adhesive layer 58 that overlap the light guide paths 51A, that is, openings 56a of the reflective layer 56 are each provided with an air layer. The light guide paths 51A formed of the air layers and the openings 56a of the reflective layer 56 are provided so as to be connected together in the third direction Dz.

With such a configuration, the light propagating in the light guide plate LG is totally reflected at interfaces between the adhesive layer 58 provided on the surface of the light guide plate LG facing the optical filter layer 50 and the air layers provided in the openings 56a of the reflective layer 56 in the areas overlapping the light guide paths 51A, and does not enter the photodiode 30. The light propagating in the light guide plate LG is reflected by the reflective layer 56 in the area overlapping the light-blocking portion 55, and returns into the light guide plate LG. The configuration in which the light guide paths 51A of the optical filter layer 50 are formed of the air layers is not limited to the present embodiment and may be combined with other embodiments.

Fourth Embodiment

Figure 13:
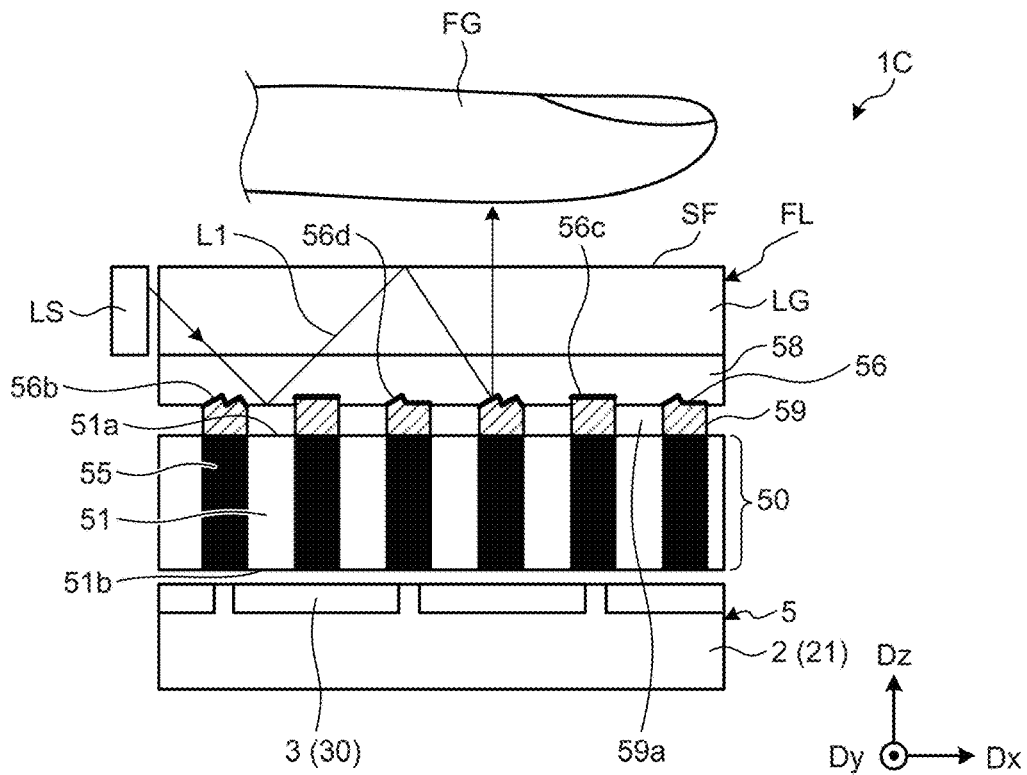
FIG. 13 is a sectional view illustrating a schematic sectional configuration of a detection device according to a fourth embodiment of the present disclosure.
Figure 14:
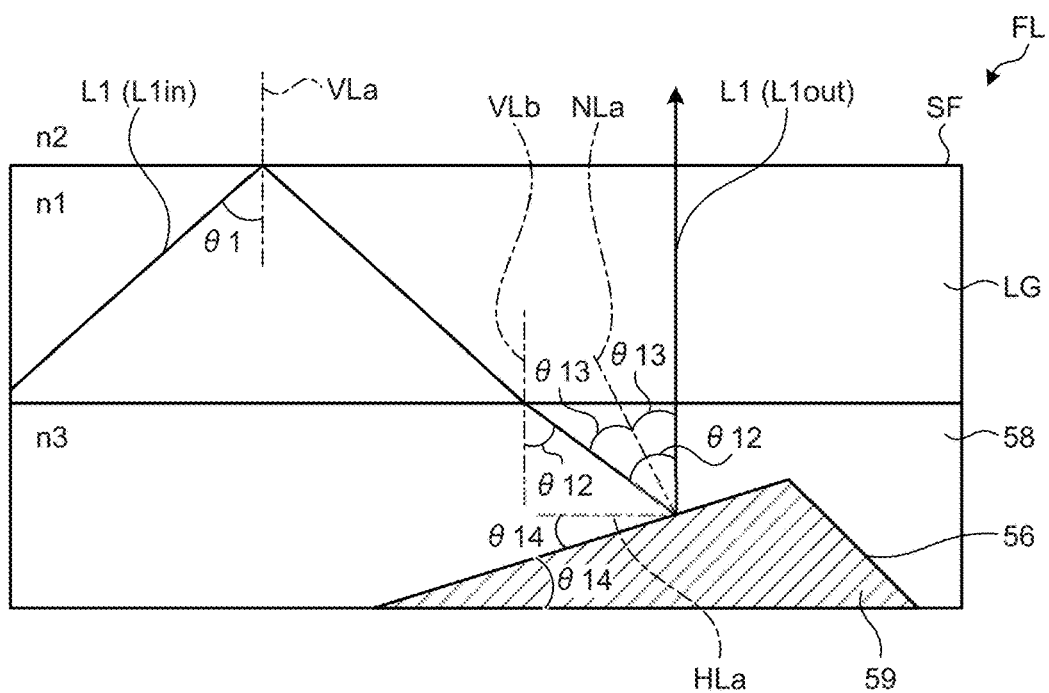
FIG. 14 is a sectional view illustrating a sloped portion of the reflective layer of the detection device according to the fourth embodiment.

FIG. 13 is a sectional view illustrating a schematic sectional configuration of a detection device according to a fourth embodiment of the present disclosure. FIG. 14 is a sectional view illustrating a sloped portion of the reflective layer of the detection device according to the fourth embodiment.

As illustrated in FIG. 13, a detection device 1C according to the fourth embodiment is provided with a support 59 in an area overlapping the light-blocking portion 55 between the light guide plate LG and the optical filter layer 50. Each area of a surface of the support 59 facing the light guide plate LG has a sloped surface, a flat surface, or both.

The reflective layer 56 is provided on the surface of the support 59 facing the light guide plate LG. The reflective layer 56 has a sloped portion provided along the sloped surface of the support 59 and a flat portion provided along the flat surface of the support 59. The sloped portion of the reflective layer 56 is provided at an angle to the surface of the light guide plate LG facing the optical filter layer 50. The flat portion of the reflective layer 56 is provided parallel to the surface of the light guide plate LG facing the optical filter layer 50. The sloped portions and the flat portions of the reflective layer 56 are arranged such that each area has a different area ratio thereof. For example, a reflective layer 56b is composed of a plurality of sloped portions. A reflective layer 56c is composed of a flat portion without including a sloped portion. A reflective layer 56d is composed of sloped portions and a flat portion.

The light guide plate LG is bonded to the reflective layer 56 with the adhesive layer 58 interposed therebetween. The adhesive layer 58 has a thickness that can accommodate the difference in height between the sloped portion and the flat portion of the reflective layer 56. Air layers are provided in the areas overlapping the light guide paths 51 between the optical filter layer 50 and the adhesive layer 58, that is, in openings 59a of the support 59.

In the present embodiment, the sloped portions of the reflective layer 56 have also the functions of the scattering portions SC11 and SC12 (refer to FIGS. 2 and 10) of the embodiments described above. That is, in the present embodiment, the surface facing the optical filter layer 50 and the detection surface SF of the light guide plate LG are each formed as a flat surface, and the scattering portions SC11 and SC12 are not provided.

With such a configuration, the light propagating in the light guide plate LG is totally reflected at interfaces between the adhesive layer 58 provided on the surface of the light guide plate LG facing the optical filter layer 50 and the air layers (in the openings 59a of the support 59) in the areas overlapping the light guide paths 51, and does not enter the photodiode 30. The light propagating in the light guide plate LG is reflected by the sloped portions of the reflective layer 56 in the area overlapping the light-blocking portion 55. The light reflected by the sloped portions of the reflective layer 56 changes the traveling direction to the third direction Dz and is emitted toward the object to be detected FG.

In more detail, as illustrated in FIG. 14, the sloped portion of the reflective layer 56 is sloped at an angle θ14 with respect to a horizontal line HLa. The angle θ14 of the sloped portion of the reflective layer 56 is, for example, θ14=18.0°. The adhesive layer 58 is provided in contact with the sloped portions of the reflective layer 56 so as to cover the entire sloped portions.

The light Llin propagating in the light guide plate LG has an incident angle of θ1 or larger with respect to a normal VLa of the detection surface SF. The angle θ1 is an angle of total reflection of the detection surface SF. If the refractive index n1 of the light guide plate LG is, for example, n1=1.49 and the refractive index n2 of air is n2=1, the angle θ1 is θ1=42.2° or larger.

The light Llin is refracted at the interface between the light guide plate LG and the adhesive layer 58 according to Snell's law and travels in the adhesive layer 58 at an angle θ12 with respect to a normal VLb of the interface between the light guide plate LG and the adhesive layer 58. If a refractive index n3 of the adhesive layer 58 is, for example, n3=1.70, the angle θ12 is θ12=36.0°.

The light Llin in the adhesive layer 58 is incident on the sloped portion of the reflective layer 56 at an angle θ13 with respect to a normal NLa of the sloped portion of the reflective layer 56. The light Llout reflected by the sloped portion of the reflective layer 56 is emitted toward a side opposite to the direction of incidence of the light Llin at the angle θ13 with respect to the normal NLa. In the example illustrated in FIG. 14, the light Llout travels in a direction parallel to the normal VLa of the detection surface SF. In this case, the angle θ13 is θ13=(1/2)×θ12=18.0°. With such a configuration, the light L1 that has propagated in the light guide plate LG is emitted toward the object to be detected FG by the sloped portion of the reflective layer 56.

In the detection device 1C of the present embodiment, the sloped portions of the reflective layer 56 having the functions of the scattering portions SC11 and SC12 (refer to FIGS. 2 and 10) are provided on the optical filter layer 50 side. Therefore, the detection device 1C according to the fourth embodiment does not require high positional accuracy between the light guide plate LG and the optical filter layer 50, unlike each of the embodiments described above.

Fifth Embodiment

Figure 15:
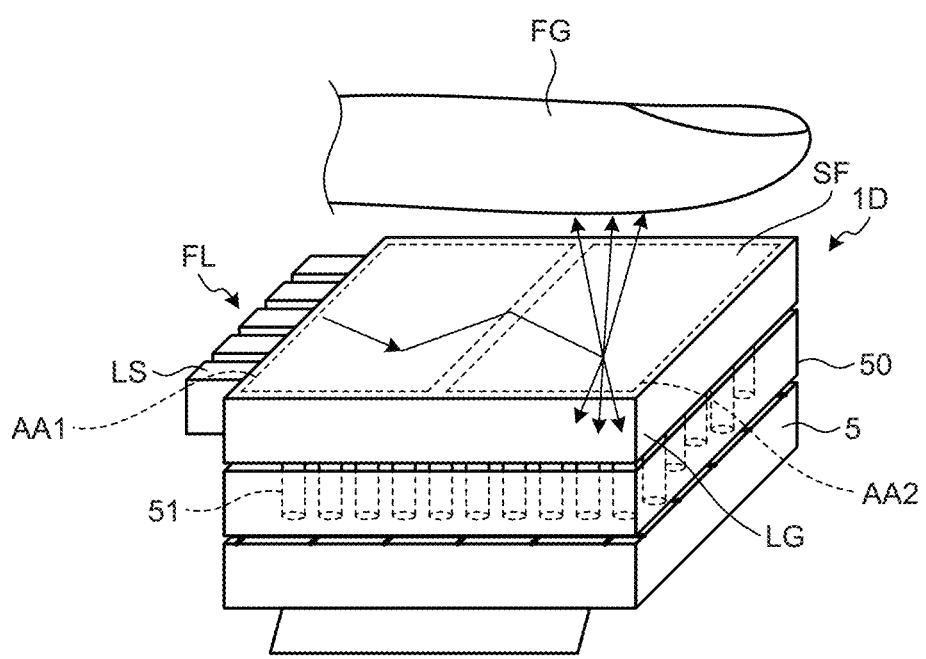
FIG. 15 is a perspective view schematically illustrating a detection device according to a fifth embodiment of the present disclosure.
Figure 16:
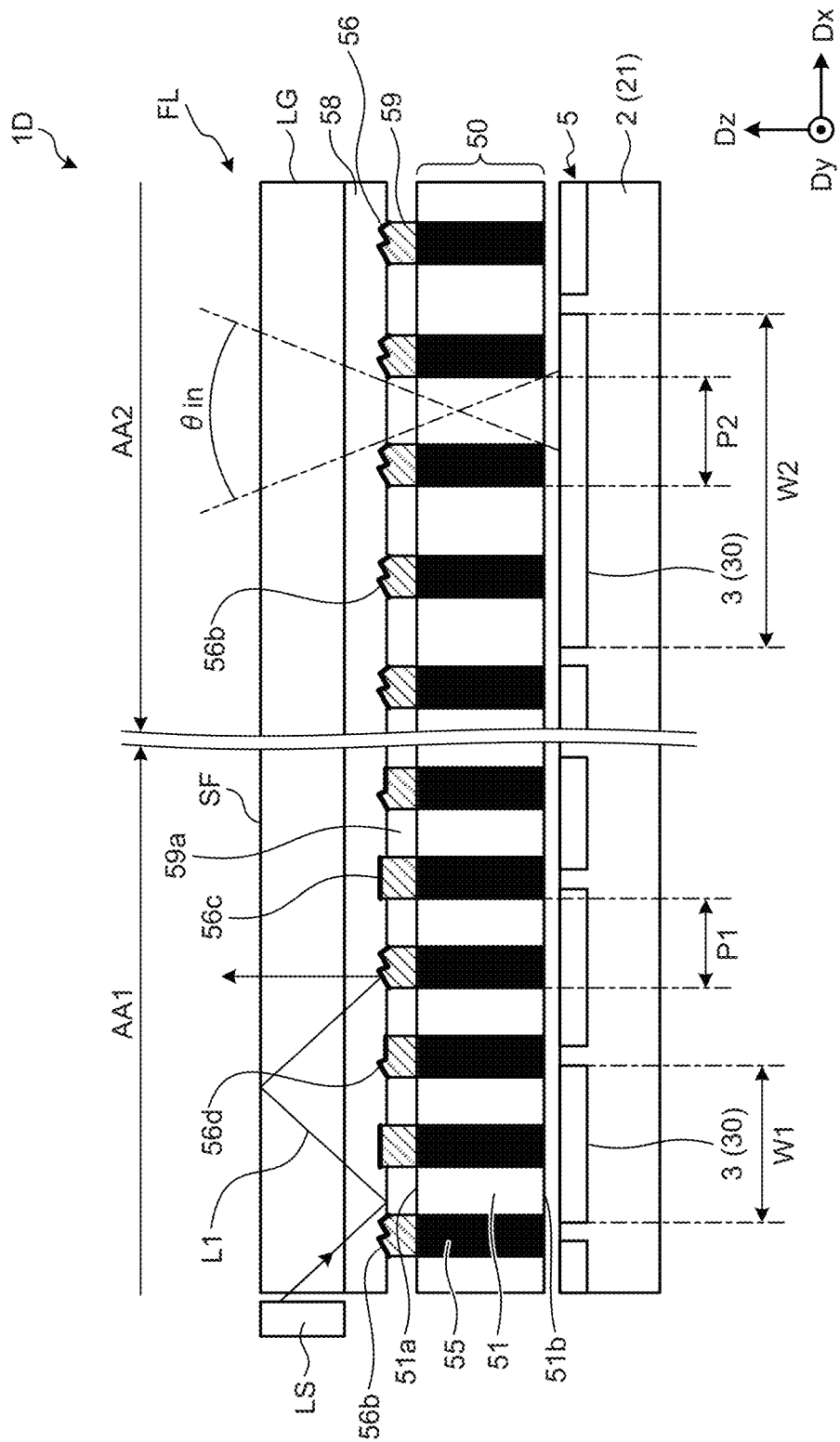
FIG. 16 is a sectional view illustrating a schematic sectional configuration of the detection device according to the fifth embodiment.

FIG. 15 is a perspective view schematically illustrating a detection device according to a fifth embodiment of the present disclosure. FIG. 16 is a sectional view illustrating a schematic sectional configuration of the detection device according to the fifth embodiment.

As illustrated in FIGS. 15 and 16, in a detection device 1D according to the fifth embodiment, the light guide plate LG has a first detection area AA1 and a second detection area AA2 arranged side by side in the first direction Dx. The first detection area AA1 is an area closer to the light source LS. The second detection area AA2 is an area farther than the first detection area AA1 from the light source LS.

As illustrated in FIG. 16, the area of the flat portions of the reflective layer 56 in the first detection area AA1 closer to the light source LS is larger than the area of the flat portions of the reflective layer 56 in the second detection area AA2 farther from the light source LS. In other words, the area (arrangement density) of the sloped portions of the reflective layer 56 in the second detection area AA2 farther from the light source LS is larger than the area (arrangement density) of the sloped portions of the reflective layer 56 in the first detection area AA1 closer to the light source LS. In the present embodiment, the area of the flat portions of the reflective layer 56 and the area of the sloped portions of the reflective layer 56 are compared in size with each other based on the size of an area overlapping one photodiode 30.

Specifically, in the first detection area AA1, the reflective layers 56b each composed of a plurality of sloped portions, the reflective layers 56c each composed of a flat portion without including a sloped portion, and the reflective layers 56d each composed of sloped and flat portions are arranged in the first direction Dx. In the second detection area AA2, the reflective layers 56c and 56d are not provided, and the reflective layers 56b each composed of a plurality of sloped portions are arranged in the first direction Dx.

As a result, in the detection device 1D according to the fifth embodiment, compared with a configuration in which the flat portions and the sloped portions of the reflective layer 56 are provided at the same arrangement density in the first and the second detection areas AA1 and AA2, more light is reflected toward the object to be detected FG in the third direction Dz by the sloped portions of the reflective layer 56 in the second detection area AA2 farther from the light source LS, and the light can be extracted at a higher efficiency. This configuration can reduce a difference in intensity distribution of the light emitted toward the object to be detected FG such as the finger between the first and the second detection areas AA1 and AA2. Therefore, the detection device 1D can reduce detection variations that would be caused by the difference in distance from the light source LS.

In addition, as illustrated in FIG. 16, in the detection device 1D according to the fifth embodiment, arrangement pitches P1 and P2 in the reflective layer 56 and the light-blocking portion 55 are different, and element sizes (widths W1 and W2) of the photodiodes 30 are different between the first and the second detection areas AA1 and AA2. Specifically, the arrangement pitch P2 in the reflective layer 56 and the light-blocking portion 55 in the second detection area AA2 is larger than the arrangement pitch P1 in the reflective layer 56 and the light-blocking portion 55 in the first detection area AA1. In other words, the diameter of the light guide paths 51 in the second detection area AA2 is larger than the diameter of the light guide paths 51 in the first detection area AA1. In addition, the width W2 in the first direction Dx of the photodiode 30 in the second detection area AA2 is larger than the width W1 in the first direction Dx of the photodiode 30 in the first detection area AA1.

As a result, a light entrance angle θin in the second detection area AA2 is larger than that in the first detection area AA1. The light entrance angle θin is an angular range of the light reflected by the object to be detected FG that can enter the photodiode 30 through the light guide path 51. Increasing the light entrance angle θin can increase the amount of light incident on the photodiode 30 even in a configuration in which the scattering portions SC11 and SC12 are not provided in the areas of the light guide plate LG overlapping the light guide paths 51. The amount of light incident on one photodiode 30 can be increased in the second detection area AA2 farther from the light source LS, and the difference in the amount of light between the first and the second detection areas AA1 and AA2 can be adjusted.

FIG. 16 illustrates the configuration in which the area (size) of the flat portions of the reflective layer 56 is different between the first and the second detection areas AA1 and AA2, and the arrangement pitches P1 and P2 in the reflective layer 56 and the light-blocking portion 55 and the element sizes (widths W1 and W2) of the photodiodes 30 are different between the first and the second detection areas AA1 and AA2. The configuration is, however, not limited to this configuration. The arrangement pitches P1 and P2 in the reflective layer 56 and the light-blocking portion 55 and the element sizes (widths W1 and W2) of the photodiodes 30 may be the same between the first and the second detection areas AA1 and AA2. The configuration in which the arrangement pitches P1 and P2 in the reflective layer 56 and the light-blocking portion 55 are different between the first and the second detection areas AA1 and AA2 and the configuration in which the element sizes (widths W1 and W2) of the photodiodes 30 are different between the first and the second detection areas AA1 and AA2 may be combined with each of the first to the fourth embodiments described above.

In each of the embodiments described above, the optical filter layer 50 has been illustrated as a light guide column structure in which the light guide paths 51 are formed in column shapes, but the structure is not limited thereto and various configurations can be applied. For example, the optical filter layer 50 may have a multilayered pinhole structure in which a plurality of light-blocking layers provided with a plurality of pinholes and light-transmitting resin layers are alternately stacked. Alternatively, the optical filter layer 50 may have a configuration in which a plurality of light-transmitting optical fibers are solidified together by a colored resin layer (light-blocking portion 55). Alternatively, the optical filter layer 50 may have a configuration in which light-blocking layers and light-transmitting layers stacked in a louver shape are arranged so as to be orthogonal to each other. Alternatively, the optical filter layer 50 may be provided with microlenses as required.

While the preferred embodiments of the present disclosure have been described above, the present disclosure is not limited to the embodiments described above. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure. At least one of various omissions, substitutions, and changes of the components can be made without departing from the gist of the embodiments and modifications described above.

What is claimed is:

1. A detection device comprising:
   a plurality of photodiodes arranged on a substrate;
   a front light comprising a light guide plate disposed so as to overlap the photodiodes and a light source configured to emit light to a side surface of the light guide plate; and
   an optical filter layer provided between the photodiodes and the light guide plate of the front light, wherein
   the optical filter layer comprises:
      a plurality of light guide paths arranged as an array of individual and separate light guide paths, and the light guide paths each respectively at least partially overlap the photodiodes, and
      a light-blocking portion having higher absorptance of the light than the light guide paths, the light-blocking portion being disposed between the light guide paths, and the detection device comprises a reflective layer that is provided between the light guide plate and the optical filter layer and overlaps the light-blocking portion of the optical filter layer.

2. The detection device according to claim 1, comprising a plurality of scattering portions that are provided on the light guide plate and configured to scatter the light from the light source, wherein
   the scattering portions each protruding from a surface of the light guide plate are provided in an area overlapping the light-blocking portion of the optical filter layer and the reflective layer, the surface facing the optical filter layer.

3. The detection device according to claim 2, wherein the scattering portions are dot-shaped or prismatic.

4. The detection device according to claim 1, wherein the reflective layer is bonded to the light guide plate with an adhesive layer interposed between the reflective layer and the light guide plate.

5. The detection device according to claim 4, comprising a plurality of scattering portions that are provided on the light guide plate and configured to scatter the light from the light source, wherein
   the scattering portions each protruding from a surface of the light guide plate are provided, the surface being opposite to a surface facing the optical filter layer.

6. The detection device according to claim 5, wherein the scattering portions are dot-shaped or prismatic.

7. The detection device according to claim 1, comprising a light-transmitting resin layer provided between the reflective layer and the light guide plate.

8. The detection device according to claim 7, comprising a plurality of scattering portions that are provided on the light guide plate and configured to scatter the light from the light source, wherein
   the scattering portions each protruding from a surface of the light guide plate are provided, the surface being opposite to a surface facing the optical filter layer.

9. The detection device according to claim 8, wherein the scattering portions are dot-shaped or prismatic.

10. The detection device according to claim 1, wherein
    the light guide paths of the optical filter layer are a light-transmitting resin, and
    areas that are located between the light guide plate and the optical filter layer and overlap the light guide paths of the optical filter layer are each an air layer.

11. The detection device according to claim 1, wherein each of the light guide paths of the optical filter layer is an air layer.

12. The detection device according to claim 1, wherein the reflective layer comprises a sloped portion provided at an angle with respect to a surface of the light guide plate facing the optical filter layer and a flat portion provided parallel to the surface of the light guide plate facing the optical filter layer.

13. The detection device according to claim 12, wherein the light guide plate comprises a first detection area and a second detection area farther than the first detection area from the light source, and
an area of the flat portion in the first detection area is larger than that of the flat portion in the second detection area.

14. The detection device according to claim 1, wherein the reflective layer is provided at an upper surface of the light-blocking portion, the upper surface facing the light guide plate.

15. The detection device according to claim 1, wherein at least some light guide paths overlap at least two photodiodes.

* * * * *